(12) United States Patent
Hein et al.

(10) Patent No.: US 8,026,959 B2
(45) Date of Patent: Sep. 27, 2011

(54) INTEGRATED CIRCUIT FOR RECEIVING DATA

(75) Inventors: Thomas Hein, München (DE); Andreas Täuber, Unterschleißheim (DE)

(73) Assignee: Qimonda AG, Munich (DE)

( * ) Notice: Subject to any disclaimer, the term of this patent is extended or adjusted under 35 U.S.C. 154(b) by 1076 days.

(21) Appl. No.: 11/668,849

(22) Filed: Jan. 30, 2007

(65) Prior Publication Data
US 2007/0180185 A1 Aug. 2, 2007

(30) Foreign Application Priority Data
Jan. 30, 2006 (DE) .......................... 10 2006 004 229

(51) Int. Cl.
*H04N 5/217* (2006.01)
*G06F 12/00* (2006.01)

(52) U.S. Cl. ........................................ 348/241; 711/100

(58) Field of Classification Search ...................... None
See application file for complete search history.

(56) References Cited

U.S. PATENT DOCUMENTS

| | | | |
|---|---|---|---|
| 6,323,699 B1 * | 11/2001 | Quiet | 327/108 |
| 6,404,256 B2 * | 6/2002 | Minami et al. | 327/276 |
| 6,538,488 B2 * | 3/2003 | Zhang et al. | 327/294 |
| 6,829,316 B1 * | 12/2004 | Terada et al. | 375/355 |
| 6,853,225 B2 | 2/2005 | Lee | |
| 7,084,672 B1 * | 8/2006 | Meng et al. | 327/51 |
| 7,173,453 B2 * | 2/2007 | Prather et al. | 326/80 |
| 7,206,234 B2 * | 4/2007 | Pan et al. | 365/194 |
| 2004/0124900 A1 * | 7/2004 | Brox | 327/277 |

FOREIGN PATENT DOCUMENTS

KR    20040008910    1/2004

* cited by examiner

*Primary Examiner* — Luong T Nguyen
(74) *Attorney, Agent, or Firm* — Edell, Shapiro & Finnan, LLC

(57) ABSTRACT

An integrated circuit for receiving data includes an input receiver circuit that is supplied with a data signal and a reference signal. The input receiver circuit converts the data signal into differential input control signals that are supplied to first and second signal paths. The first and second signal paths being connected in parallel. The first signal path includes a first comparator circuit that is connected, via a delay circuit and an amplifier circuit, to an output connection of the integrated circuit. The second signal path includes a second comparator circuit that is likewise connected, via a first inverter circuit and a second inverter circuit, to the output connection of the integrated circuit. The two amplifier circuits act as edge discriminators that drive each other and make it possible to generate, at the output connection, an output signal with the same duty cycle as the data signal without distortion.

17 Claims, 7 Drawing Sheets

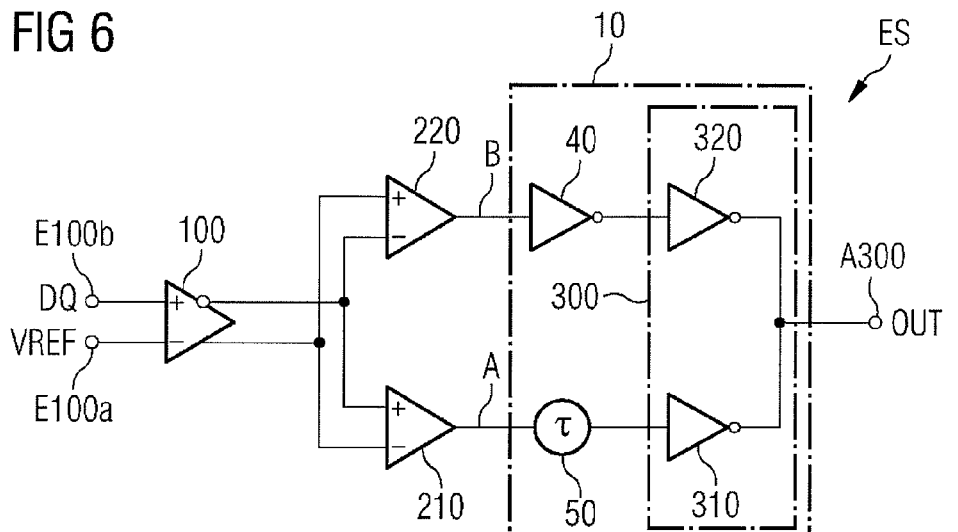
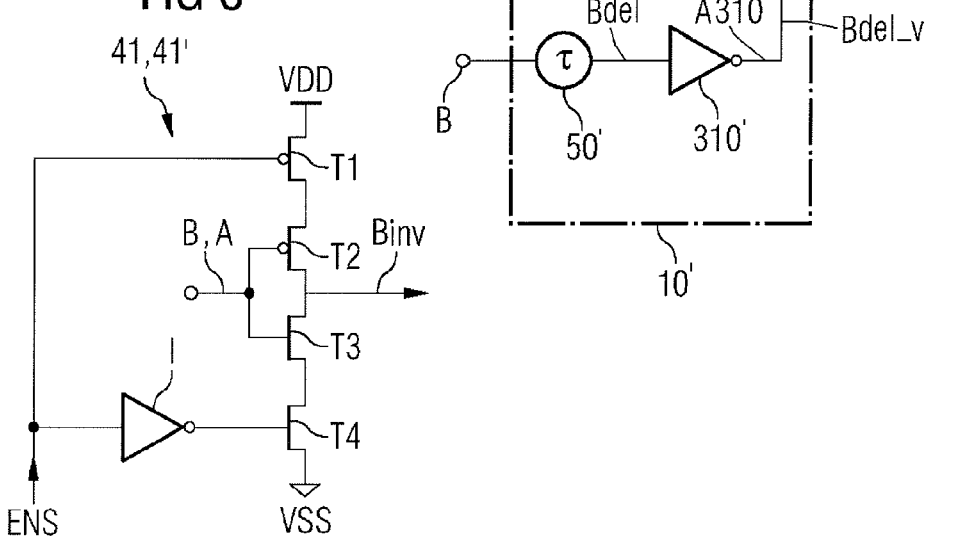

INTEGRATED CIRCUIT FOR RECEIVING DATA

CROSS REFERENCE TO RELATED APPLICATIONS

This application claims priority under 35 U.S.C. §119 to Application No. DE 102006004229.8 filed on Jan. 30, 2006, entitled "Integrated Circuit for Receiving Data," the entire contents of which are hereby incorporated by reference.

BACKGROUND

An integrated semiconductor memory, for example a DRAM (Dynamic Random Access Memory) semiconductor memory, generally includes control connections for applying control signals, address connections for applying address signals, and data connections for applying data. In the event of a write access operation, a write command is applied to the control connections and an address signal is applied to the address connections. This makes it possible to activate at least one memory cell in a memory cell array of the integrated semiconductor memory for a write access operation.

The data to be stored is applied to the data connections which are connected to receiving circuits in the semiconductor memory. The characteristic variables of the specification for a receiving circuit for receiving data include the set-up times and hold times. The latter are used to specify the time for which a data item must be applied at least to one of the data connections in order to be able to read the data item into the semiconductor memory in a clear and reliable manner. As a result of the increase in the access speed and thus in the operating frequency during the development of semiconductor memories in recent years, the time window in which valid data is applied to the semiconductor memory has become increasingly small. The receiving circuits must therefore accept the data into the semiconductor memory from the data connections within a very small time window.

FIG. 1 shows an integrated circuit ES' of a semiconductor memory, in which a differential amplifier D is connected to an input connection E1 for applying a reference signal VREF and to an input connection E2 for applying a data signal (e.g., an input signal) DQ. The differential amplifier D compares a level of the data signal DQ with a level of the reference signal VREF and generates, at the output, an output signal which has a high or low level, is amplified by downstream amplifiers V1 and V2 and is forwarded to an output connection A. From there, the amplified data signals are generally supplied, via read/write amplifiers, to a memory cell array of an integrated semiconductor memory.

As shown in FIG. 1, input signals for the integrated semiconductor memory, for example the data signals DQ, are received using a differential amplifier. The problem with this is, in particular, that the differential amplifier is not driven by differential input signals but rather by an input signal level and a constant reference signal level. In this case, different delays generally arise when receiving a rising or falling edge of the input signal. This consequently produces, at the output connection A, an output signal whose duty cycle is distorted with respect to the input signal. If, for example, the differential amplifier is supplied with an input signal which, during a clock period, has a high level for half of the period duration and a low level for the other half of the period duration, an output signal in which the high and low levels have different durations is produced at the output connection A.

SUMMARY

The described device relates to an integrated circuit for receiving data. The integrated circuit includes an input receiver circuit that is supplied with a data signal and a reference signal. The input receiver circuit converts the data signal into differential input control signals that are supplied to first and second signal paths. The first and second signal paths being connected in parallel. The first signal path includes a first comparator circuit that is connected, via a delay circuit and an amplifier circuit, to an output connection of the integrated circuit. The second signal path includes a second comparator circuit that is likewise connected, via a first inverter circuit and a second inverter circuit, to the output connection of the integrated circuit. The two amplifier circuits act as edge discriminators that drive each other and make it possible to generate, at the output connection, an output signal with the same duty cycle as the data signal without distortion.

The above and still further features and advantages of the integrated circuit will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The integrated circuit is explained in more detail below with reference to exemplary embodiments, where:

FIG. 6 shows a first embodiment of the integrated circuit for receiving data and for generating complementary output signals;

FIG. 8 shows an embodiment of an inverter circuit of the integrated circuit for receiving data.

DETAILED DESCRIPTION

Figure 1:
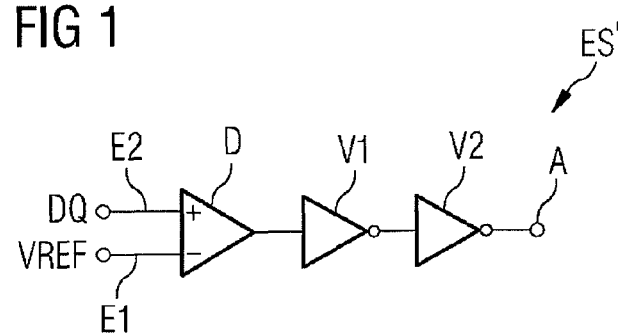
FIG. 1 shows a known integrated circuit for receiving data.

The integrated circuit described herein converts an input signal into an output signal with as little distortion as possible. The integrated circuit includes a first input connection for applying a reference signal and a second input connection for applying an input signal and an output connection for generating an output signal. The integrated circuit further comprises an input receiver circuit for receiving the input signal and the reference signal and for generating first and second input control signals. In this case, the input receiver circuit is configured such that a respective level of the first and second input control signals is generated on the basis of a respective level of the input signal and of the reference signal, and also generates a level profile of the first input control signal that is complementary to a level profile of the second input control signal. In addition, the integrated circuit includes a first comparator circuit with an input side for receiving the first and second input control signals and an output side for generating a first comparison signal, the first comparator circuit being configured such that it generates the first comparison signal on the basis of a level of the first and second input control signals. The integrated semiconductor memory also includes a second comparator circuit with an input side for receiving the first and second input control signals and an output side for generating a second comparison signal, the second comparator circuit being configured such that it generates the second comparison signal on the basis of the level of the first and second input control signals. The integrated circuit further comprises an inverter circuit whose input is supplied with the second comparison signal for generating an inverted second comparison signal. The integrated circuit also includes a delay circuit whose input is supplied with the first comparison signal for generating a first comparison signal which is delayed with respect to the first comparison signal. The integrated circuit further comprises a first amplifier circuit for amplifying the delayed first comparison signal and generating a first output signal, the first output signal being amplified in comparison to the delayed first comparison signal. In addition, the integrated circuit includes a second amplifier circuit for amplifying the inverted second comparison signal and generating a second output signal. The output connections of the first and second amplifier circuits are connected to the output connection of the integrated circuit.

One embodiment of the integrated circuit comprises an activation circuit for activating/deactivating the delay circuit includes an input connection for applying an activation signal. The activation circuit is designed in such a manner that it generates, at the output, a first control signal for activating/deactivating the delay circuit on the basis of a state of the activation signal.

According to another embodiment of the integrated circuit, a first controllable switch is connected between a connection for applying a reference potential and the input side of the first amplifier circuit. The first controllable switch is configured such that it can be turned on, on the basis of a state of the first control signal, the input side of the first amplifier circuit being connected to the connection for applying the reference potential when the first controllable switch is turned on.

Another embodiment of the integrated circuit comprises a second controllable switch to be connected between a connection for applying the reference potential and the input side of the second amplifier circuit. The second controllable switch is configured such that it can be turned on, on the basis of a state of the first control signal, the input side of the second amplifier circuit being connected to the connection for applying the reference potential when the second controllable switch is turned on.

According to another embodiment of the integrated circuit, the first and second comparator circuits are configured such that they can be activated by the activation signal. The first comparator circuit generates the first comparison signal on the basis of a level of the first and second input control signals when it is activated. The second comparator circuit generates the second comparison signal on the basis of a level of the first and second input control signals when it is activated.

Another embodiment of the integrated circuit includes a further output connection for generating a further output signal. The integrated circuit further comprises an inverter circuit whose input is supplied with the first comparison signal for the purpose of generating a further inverted second comparison signal. A further embodiment comprises a further delay circuit whose input is supplied with the second comparison signal for the purpose of generating a further second comparison signal which is delayed with respect to the second comparison signal. In addition, the integrated circuit comprises a further first amplifier circuit for amplifying a signal, which is supplied to the input of the further first amplifier circuit, at the output and includes an input side for supplying the further delayed second comparison signal and an output connection for generating a further first output signal. Another embodiment further comprises a further second amplifier circuit which is intended to amplify a signal, which is supplied to the input of the further second amplifier circuit, at the output and includes an input side for supplying the further delayed second comparison signal and an output connection for generating a further second output signal. The output connections of the further first and second amplifier circuits are connected to the further output connection.

Another embodiment provides a further activation circuit which is intended to activate/deactivate the further delay circuit and is connected to the input connection for applying the activation signal. In this case, the further activation circuit is configured such that, at the output, a second control signal is generated for activating/deactivating the further delay circuit on the basis of a state of the activation signal.

In another embodiment of the integrated circuit, the integrated circuit includes a further first controllable switch which is connected between a connection for applying a supply potential and the input side of the further first amplifier circuit. In this case, the further first controllable switch is designed in such a manner that it can be turned on, on the basis of a state of the activation signal, the input side of the further first amplifier circuit being connected to the connection for applying the supply potential when the further first controllable switch is turned on.

Another embodiment of the integrated circuit comprises a further second controllable switch which is connected between a connection for applying the supply potential and the input side of the further second amplifier circuit. The further second controllable switch is configured such that it can be turned on, on the basis of the state of the activation signal, the input side of the further second amplifier circuit being connected to the connection for applying the supply potential when the further second controllable switch is turned on.

According to another embodiment of the integrated circuit, the input receiver circuit comprises a first transistor with a control connection for applying a control signal and including a first connection for generating the first input control signal and a second transistor comprising a control connection for applying a control signal and including a first connection for generating the second input control signal. The first connection of the first transistor is connected, via a first resistor, to a connection for applying the supply potential, and a second connection of the first transistor is connected, via a current source, to a connection for applying the reference potential. The first connection of the second transistor is connected, via a second resistor, to the connection for applying the supply potential. A second connection of the second transistor is connected, via the current source, to the connection for applying the reference potential.

In another embodiment of the integrated circuit, the first comparator circuit is in the form of a first differential amplifier circuit and the second comparator circuit is in the form of a second differential amplifier circuit, the differential amplifier circuits each comprising a first input connection for applying a respective input signal and a second input connection for applying a respective reference signal. The first connection of the first transistor of the input receiver circuit is connected to the second input connection of the first differential amplifier circuit and to the first input connection of the second differential amplifier circuit. The first connection of the second transistor of the input receiver circuit is connected to the first input connection of the first differential amplifier circuit and to the second input connection of the second differential amplifier circuit.

According to another embodiment of the integrated circuit, the inverter circuit is in the form of a tristate inverter. The delay circuit may be in the form of a CMOS transfer gate. In one preferred embodiment, the controllable switches and the further controllable switches are each in the form of switching transistors. In this case, the first and second controllable switches and the further first and second controllable switches may each be in the form of switching transistors of different conductivity types. Another embodiment of the integrated circuit provides for the first and second amplifier circuits to each be in the form of an inverter circuit.

In the following paragraphs, exemplary embodiments of the integrated circuit are described in connection with the figures.

Figure 2:
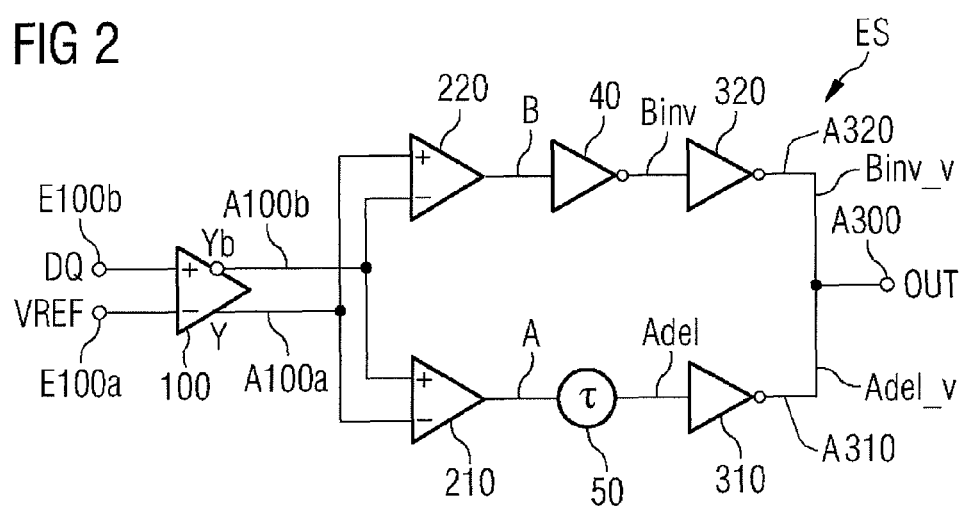
FIG. 2 shows a first embodiment of the integrated circuit for receiving data.

FIG. 2 shows a first embodiment of an integrated circuit ES for receiving a data signal DQ and for generating an output signal OUT. An input receiver circuit 100 is connected to an first input connection E100a of the integrated circuit for applying a reference signal VREF and to an second input connection E100b of the integrated circuit for applying a data signal DQ. The input receiver circuit generates an first input control signal Y at an first control signal output connection A100a and an second first input control signal Yb at an second control signal output connection A100b.

The input control signals are supplied to a first comparator circuit 210 and to a second comparator circuit 220. In this case, the first input control signal Y is supplied to an inverting input connection of the first comparator circuit 210 and to a non-inverting input connection of the second comparator circuit 220. The second input control signal Yb is supplied to a non-inverting input connection of the first comparator circuit 210 and to an inverting input connection of the second comparator circuit 220.

After the levels of the first input control signal Y and of the second input control signal Yb have been compared, the first comparator circuit 210 generates a first comparison signal A at the output. The first comparison signal A is supplied to the input of a delay circuit 50. After the first comparison signal A has been delayed by a delay time τ, the delay circuit 50 generates, at the output, a delayed first comparison signal Adel which is supplied to an input side of an first amplifier circuit 310. After the first and second input control signals Y and Yb have been compared, the second comparator circuit 220 generates, at the output, a second comparison signal B which is supplied to an inverter circuit 40. After the second comparison signal B has been inverted, the inverter circuit generates, at the output, an inverted second comparison signal Binv which is supplied to an input side of an second amplifier circuit 320.

The first amplifier circuit 310 amplifies the delayed first comparison signal Adel and generates, at the output, an first output signal Adel_v which is supplied to an output connection terminal A300 of the integrated circuit. After the inverted second comparison signal Binv has been amplified, the second amplifier circuit 320 generates, at the output, an second output signal Binv_v which is likewise supplied to the output terminal A300 of the integrated circuit. Superimposing the first and second amplified output signals Adel_v and Binv_v produces the output signal OUT of the integrated circuit at the output terminal A300.

Figure 3:
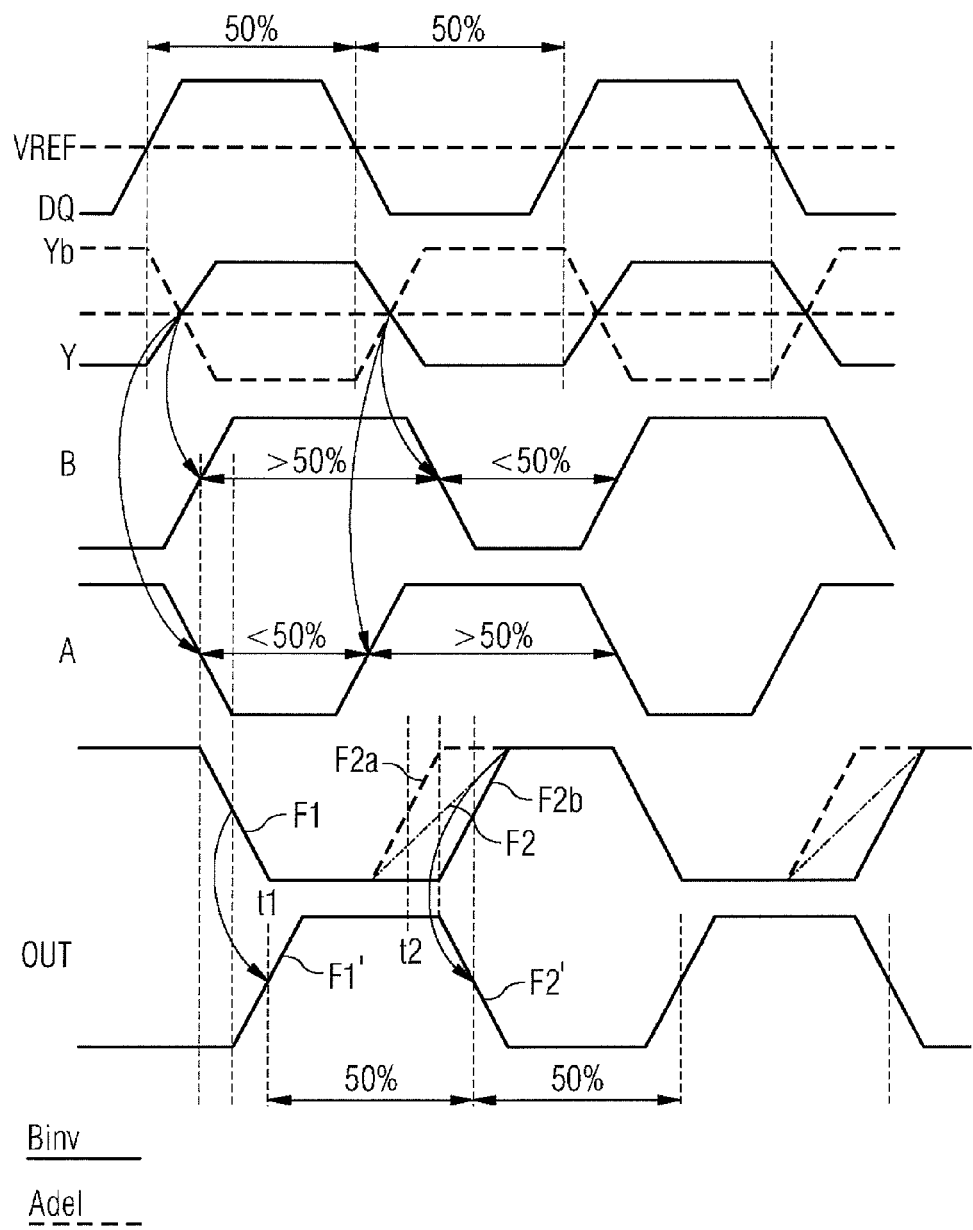
FIG. 3 shows a signal state diagram of signals in the integrated circuit shown in FIG. 2.

The fundamental method of operation of the integrated circuit shown in FIG. 2 will be explained below with reference to FIG. 3. FIG. 3 shows a signal flow diagram of signals in the integrated circuit for receiving data as shown in FIG. 2. A first signal line illustrates the profile of the data signal DQ around the constant level of the reference signal VREF. The data signal DQ has a duty cycle of 50 percent. Within a clock period, the low and high levels therefore have the same duration. The second signal line illustrates the profile of the first and second input control signals Y and Yb. The input receiver circuit 100 uses the single-ended data signal DQ to generate the differential first and second input control signals Y and Yb. As illustrated in FIG. 3, the two signal profiles are slightly offset with respect to one another. Signal distortion with respect to the duty cycle generally occurs just after the data signal DQ has been amplified by the input receiver circuit 100.

Whereas the input receiver circuit 100 amplifies the data signal DQ only slightly in the differential first and second input control signals Y and Yb, the differential first and second input control signals Y and Yb are amplified to CMOS level or to a level having an amplitude of the operating voltage of the integrated circuit in a second stage which is formed from the first and second comparator circuits 210 and 220. Since the first and second comparator circuits 210 and 220 are driven by the first and second input control signals Y and Yb at different input connections, the signal profile of the second comparison signal B that is illustrated in the third signal line is inverted with respect to the signal profile of the first comparison signal A that is illustrated in the fourth signal line. It also becomes clear that the duty cycle of the first and second comparison signals A and B has been distorted with respect to the data signal DQ. The second comparison signal B has a duty cycle of greater than 50 percent for the high level and a duty cycle of less than 50 percent for the low level. On the other hand, the first comparison signal A has a duty cycle of less than 50 percent for the low level and a duty cycle of greater than 50 percent for the high level.

The fifth signal line illustrates the profiles of the inverted second comparison signal Binv and of the delayed first comparison signal Adel. After the second comparison signal B has been inverted, the falling edges of the delayed first comparison signal Adel and of the inverted second comparison signal Binv match. However, the rising edges of the inverted second comparison signal Binv and of the delayed first comparison signal Adel are offset with respect to one another on the basis of the delay time τ of the delay circuit 50.

The sixth signal line illustrates the profile of the output signal OUT which is generated by superimposing the first amplified output signal Adel_v generated by the first amplifier circuit 310 and the second amplified output signal Binv_v generated by the second amplifier circuit 320. The first and second amplifier circuits 310 and 320 act as a mixer circuit or as an edge discriminator, which drive one another. After mixing, a rising edge F1' of the output signal OUT results, after a time t1, from the common falling edge F1 of both signals. The rising edge F2a of the delayed first comparison signal Adel and the rising edge F2b of the inverted second comparison signal Binv, which are apart, are mixed together by the first and second amplifier circuits 310 and 320, which drive one another, such that a falling edge F2' of the output signal OUT results from an average rising edge F2 after a time t2.

As shown in FIG. 3, the output signal OUT has a duty cycle of 50 percent for the high level to 50 percent for the low level. This also corresponds to the duty cycle of the input signal (e.g., the data signal DQ). The delay circuit 50 needs to be designed such that the signal propagation time in the lower signal path of the integrated circuit shown in FIG. 2, which is formed from the first comparator circuit 210, the delay circuit 50 and the first amplifier circuit 310, and the signal propagation time in the upper signal path of the integrated circuit shown in FIG. 2, which is formed from the second comparator circuit 220, the inverter circuit 40 and the second amplifier circuit 320, are the same. This ensures that the falling edges of the inverted second comparison signal Binv and of the delayed first comparison signal Adel coincide. The use of two parallel paths, which drive one another, in the integrated circuit shown in FIG. 2 averages out an inherent error produced in the first and second comparator circuits 210 and 220.

Figure 4:
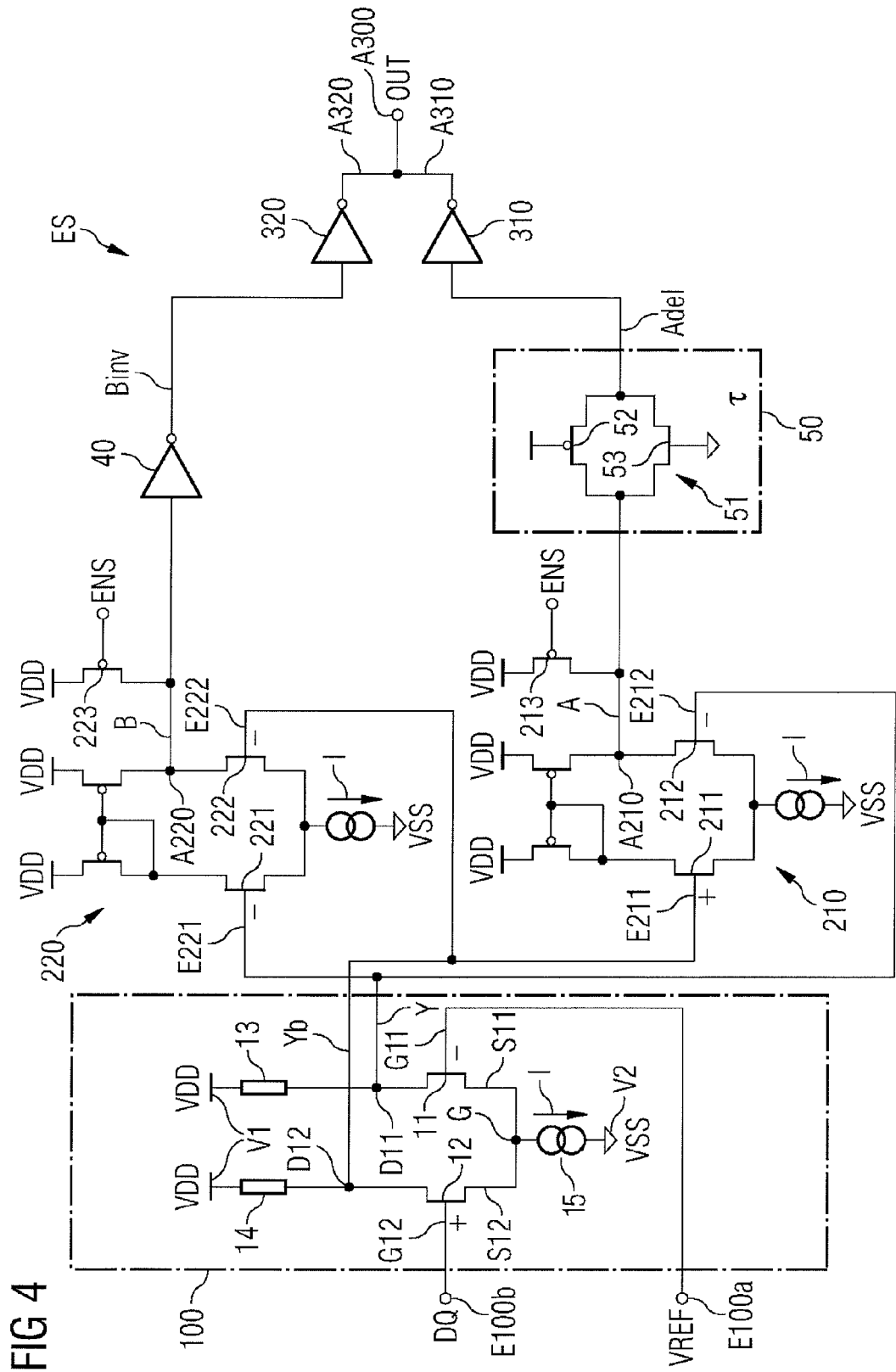
FIG. 4 shows a second embodiment of the integrated circuit for receiving data.

FIG. 4 shows a detailed refinement of the integrated circuit shown in FIG. 2. The input receiver circuit 100 comprises a first transistor 11 with a first control connection G11 that is connected to the first input connection E100a of the integrated circuit for applying the reference signal VREF. The first transistor 11 is connected, at a first input control connection D11 via a first resistor 13, to a first supply connection V1 for applying a supply voltage VDD and, via a first current source connection S11, to a common node G which, in turn, is connected, via a current source 15, to a second supply connection V2 for applying a reference potential VSS.

Furthermore, the input receiver circuit 100 further comprises a second transistor 12 with a second control connection G12 that is connected to the second input connection E100b for applying the data signal DQ. The second transistor 12 is connected, at a second input control connection D12 via a second resistor 14, to the first supply connection V1 for applying the supply voltage VDD and, via a second connection S12, to the common node G which, in turn, is connected, via the current source 15, to the second supply connection V2 for applying the reference potential VSS. The first input control signal Y, which is supplied to a first input connection E221 of the second comparator circuit 220 and to a second input connection E212 of the first comparator circuit 210, is generated at the first input control connection D11 which, when a field effect transistor is used as the first transistor 11, corresponds to a drain terminal of the first field effect transistor 11. The second input control signal Yb, which is supplied to a first input connection E211 of the first comparator circuit 210 and to a second input connection E222 of the second comparator circuit 220, is generated at the input control connection D12 which, when a field effect transistor is used as the second transistor 12, corresponds to a drain terminal of the second field effect transistor 12.

The first and second comparator circuits 210 and 220 are each in the form of differential amplifier circuits which are connected between a connection for applying the supply potential VDD and a connection for applying the reference potential VSS. The first comparator circuit 210 comprises a first input transistor 211 whose control connection is connected to the first input connection E211 of the first comparator circuit 210 and a second input transistor 212 whose control connection is connected to the second input connection E212 of the first comparator circuit 210. The second comparator circuit 220 comprises a first transistor 221 whose control connection is connected to the first input connection E221 of the second comparator circuit 220 and a second transistor 222 whose control connection is connected to the second input connection E222 of the second comparator circuit 220.

The first differential amplifier circuit 210 generates, at a first comparator output connection A210, the first comparison signal A which is supplied to the input of the delay circuit 50. The delay circuit 50 is in the form of a CMOS transfer gate 51 and comprises first and second transfer transistors 52 and 53, the two transfer transistors being of different conductivity types. The delay time τ can be prescribed by dimensioning the transfer transistors 52 and 53 in an appropriate manner and needs to be selected such that the signal propagation times in the two signal paths downstream of the first and second comparator circuits 210 and 220 are the same. The delayed first comparison signal Adel generated by the delay circuit 50 is supplied to the first amplifier circuit 310 which is in the form of an inverter circuit. A first amplifier circuit output connection A310 of the inverter circuit 310 is connected to the output terminal A300 of the integrated circuit for generating the output signal OUT.

The second comparison signal B is generated at a second amplifier circuit output connection A220 of the second differential amplifier 220 and is supplied to an input side of the inverter circuit 40 which generates the inverted second comparison signal Binv and supplies it to the second amplifier circuit 320 which is in the form of an inverter circuit. The output of the second inverter circuit 320 is connected to the output terminal A300 of the integrated circuit for generating the output signal OUT.

In order to activate the integrated circuit shown in FIG. 4, the input side of the delay circuit 50 is connected, via a first controllable switch 213 which is in the form of a p-channel field effect transistor, to the supply voltage VDD. An input side of the inverter circuit 40 is also connected, via a second controllable switch 223 which is likewise in the form of a p-channel field effect transistor, to the supply voltage VDD. Applying a state of an activation signal ENS to control connections of the controllable switches 213 and 223 turns the controllable switches on or off.

If the controllable switches 213 and 223 are turned off and are thus switched to high impedance, the potentials of the comparison signals A and B are applied to the delay circuit 50 and to the inverter circuit 40, respectively. In this case, the integrated circuit is activated. If the controllable switches are turned on via an appropriate state of the activation signal ENS, the connection for applying the supply voltage VDD is connected to the input side of the delay circuit 50 and of the inverter circuit 40, respectively, in a low-impedance manner. The potential level of the supply voltage is applied to the inverter circuit 40 and to the delay circuit 50. In this case, the circuit is deactivated.

The high potential level which is applied to the input side of the delay circuit 50 and of the inverter circuit 40 when the integrated circuit is deactivated corresponds to a logic high state. A high potential level is likewise produced at the output connection A320 of the second amplifier circuit 320 as a result of the inverter circuit 40 and the second amplifier circuit 320 which are connected in series. As a result of the transfer gate 51 being permanently turned on, the high potential level is also applied to the input side of the first amplifier circuit 310. The first amplifier circuit 310 generates a low potential level at the first amplifier circuit output connection A310. As a result of the high potential level at the second amplifier circuit output connection A320 and the low potential level at the first amplifier circuit output connection A310, a high shunt current flows between the two connections.

Figure 5:
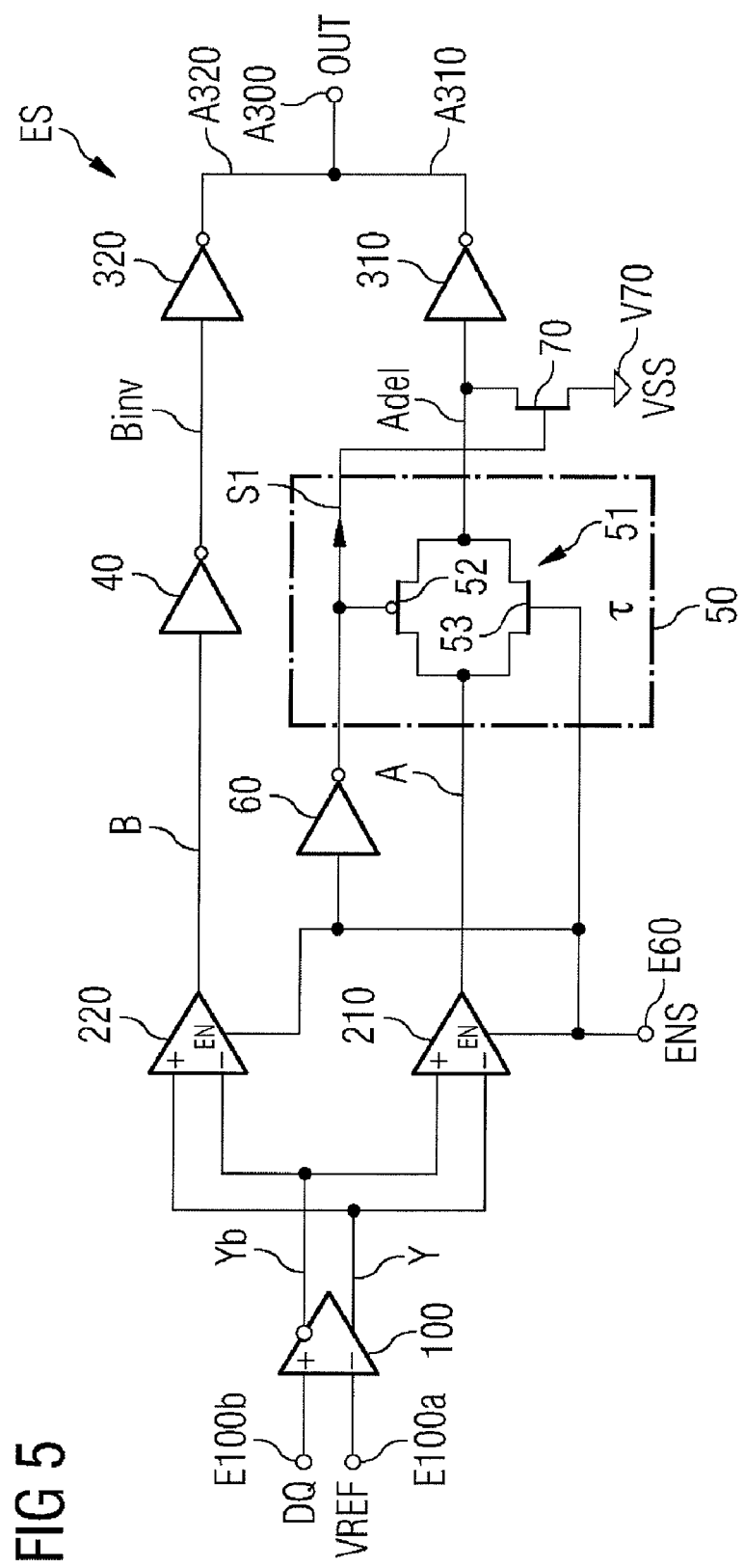
FIG. 5 shows a third embodiment of the integrated circuit for receiving data.

FIG. 5 shows an embodiment of an integrated circuit for receiving data ES which can be used to avoid the shunt current when the integrated circuit is deactivated. The first and second input control signals Y and Yb generated by the input receiver circuit 100 are forwarded to two parallel branches which are formed from a first comparator circuit 210, a delay circuit 50, with a CMOS transfer gate 51 including a first and second transfer transistors 52 and 53, and a first amplifier circuit 310 as well as from a second comparator circuit 220, an inverter circuit 40 and a second amplifier circuit 320.

The first and second comparator circuits 210 and 220 are in the form of activatable differential amplifier circuits which can be activated by applying an activation signal ENS to an activation input connection E60. To this end, the activation signal ENS is supplied to a respective activation connection EN of the activatable differential amplifier circuits. Provision is also made of an activation circuit 60 which, at the input, is driven using the activation signal ENS and, at the output, generates an activation control signal S1 which, depending on its state, activates or deactivates the CMOS transfer transistor 52 of the delay circuit 50 and is supplied to a control connection of a controllable switch 70. The controllable switch 70 is connected between an input side of the amplifier circuit 310 and a supply connection V70 for applying the supply voltage VSS. Furthermore, the activation signal ENS is supplied to the second CMOS transfer transistor 53 in order to activate or deactivate the second CMOS transfer transistor 53 depending on its state.

When the integrated circuit shown in FIG. 5 is deactivated, the controllable switch 70 is turned on by applying a low level of the activation signal ENS to the activation input connection E60, as a result of which the input side of the first amplifier circuit 310 is connected to the reference potential VSS. As a result of the first amplifier circuit 310, a high potential is thus produced at the first amplifier circuit output connection A310, with the result that both the first amplifier circuit output connection A310 and the second amplifier circuit output connection A320 are at a high potential. This avoids a shunt current between the two amplifier circuit output connections A310 and A320.

FIG. 6 shows an integrated circuit for receiving a data signal DQ and a reference signal VREF, the output signal OUT and a complimentary output signal bOUT, which is complementary to the latter, being generated at the output. As explained with reference to FIG. 2, in order to generate the output signal OUT, the first and second comparison signals A and B are supplied to a circuit unit 10 including an upper and lower signal path. The lower signal path comprising a delay circuit 50 and a first amplifier circuit 310. The upper signal path comprising an inverter circuit 40 and a second amplifier circuit 320. A complimentary circuit unit 10' including the same circuit construction as the circuit unit 10 is also provided. However, in the complimentary circuit unit 10', the first comparison signal A is supplied to the upper complimentary signal path. Furthermore, the second comparison signal B is supplied to the lower complimentary signal path. For example, the complimentary circuit unit 10' including upper and lower complimentary signal paths. The lower complimentary signal path comprising a complimentary delay circuit 50', for receiving the second comparison signal B and for generating a delayed second comparison signal Bdel, and a first complimentary amplifier circuit 310', for receiving the delayed second comparison signal Bdel and for generating, on a first complimentary output connection A310', a first complimentary amplified output signal Bdel_v. The upper complimentary signal path comprising a complimentary inverter circuit 40', for receiving the first comparison signal A and for generating an inverted first comparison signal Ainv, and a second complimentary amplifier circuit 320' for receiving the inverted first comparison signal Ainv and for generating, on a second complimentary output connection A320', a second complimentary amplified output signal. The first and second complimentary amplifier output connection A310' and A320' are connected to a complimentary output terminal A300' of the complimentary circuit unit 10' for generating the complimentary output signal bOUT. The complimentary output signal bOUT is inverted with respect to the output signal OUT.

The circuit variant shown in FIG. 6 thus makes it possible to directly generate the complementary output signal bOUT and the output signal OUT from the first and second comparison signals A and B. This makes it possible to generate the complementary signal bOUT without any offset with respect to the output signal OUT and in phase with the latter. As a result of the fact that the circuit units 10 and 10' are driven in an inverted manner, the circuit is virtually independent of process fluctuations and is thus very stable.

Figure 7:
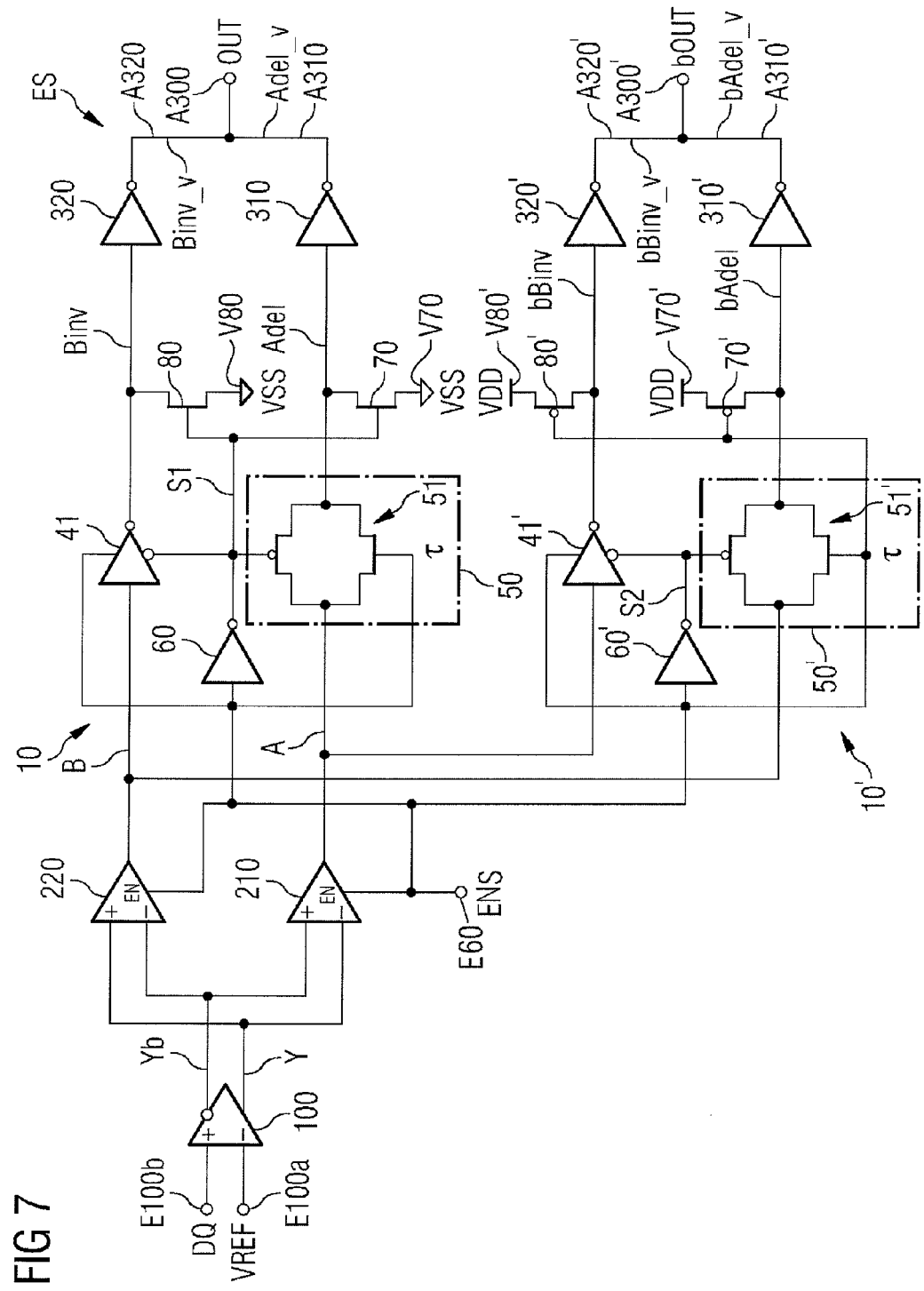
FIG. 7 shows a second embodiment of the integrated circuit for receiving data and for generating complementary output signals.

FIG. 7 shows the circuit arrangement illustrated in FIG. 6 with a higher degree of detail. Like the integrated circuit shown in FIG. 5, the integrated circuit can be activated or deactivated by driving an activation input connection E60 with an activation signal ENS. In contrast to the circuit shown in FIG. 5, the inverter circuit 40 has been replaced with a tristate inverter 41. The latter can be activated or deactivated by driving it with an appropriate state of the activation signal ENS. Furthermore, in addition to a first controllable switch 70 which connects an input side of a first amplifier circuit 310 to a reference potential VSS when it is turned on, provision is also made of a second controllable switch 80 which connects an input side of a second amplifier circuit 320 to a reference potential VSS. When the integrated circuit is deactivated, when both of the controllable switches 70 and 80 which are in the form of n-channel field effect transistors are turned on, the first amplifier circuit output connection A310 and the second amplifier output connection A320 are at a high potential level, thus avoiding a shunt current between the two output connections.

The complimentary circuit unit 10' may likewise be activated or deactivated by driving it with an appropriate state of the activation signal ENS. The upper signal path of the complimentary circuit unit 10' can be activated or deactivated using a complimentary tristate inverter 41'. The lower signal path can be activated or deactivated by driving the delay circuit 50'.

Whereas first and second controllable switches 70 and 80 which are in the form of pull-down n-channel field effect transistors are used in the two parallel signal paths of the circuit unit 10, pull-up transistors which are in the form of p-channel field effect transistors are provided in the two parallel signal paths of the complimentary circuit unit 10' as first and second complementary controllable switches 70' and 80'. When the integrated circuit is deactivated, the two pull-up transistors 70' and 80' are turned on, with the result that an input side of the first and second complementary amplifier circuits 310' and 320' is connected to a connection for applying the supply potential VDD. As a result of the first and second complimentary amplifier circuits 310' and 320', a low potential level is produced at the complimentary amplifier output connections A310' and A320', with the result that a shunt current between the complimentary amplifier output connections A310' and A320' is avoided even when the complimentary circuit unit 10' is deactivated.

FIG. 8 shows an embodiment of the tristate inverter circuits 41 and 41'. The tristate inverter comprises first, second, third and fourth tristate inverter transistors T1, T2, T3 and T4. First and second tristate inverter transistors T1 and T2 are p-channel field effect transistors and third and fourth tristate inverters T3 and T4 are n-channel field effect transistors. The four tristate inverter transistors T1, T2, T3 and T4 are connected in series between a connection for applying the supply potential VDD and a connection for applying the reference potential VSS. The control connection of the first tristate inverter transistor T1 is driven by the activation signal ENS. The control connection of the fourth tristate inverter transistor T4 is likewise driven by the activation signal ENS via an activation signal inverter I. The control connections of the second and third tristate inverter transistors T2 and T3 of the tristate inverter circuit 41 are driven by the second comparison signal B. The control connections of the second and third tristate inverter transistors T2 and T3 of the complementary tristate inverter circuit 41' are driven by the first comparison signal A.

If, as a result of a high level of the activation signal ENS, the first and fourth tristate inverter transistor transistors T1 and T4 are operated such that they are turned off, the tristate inverter circuit 41, 41' is deactivated.

Figure 9:
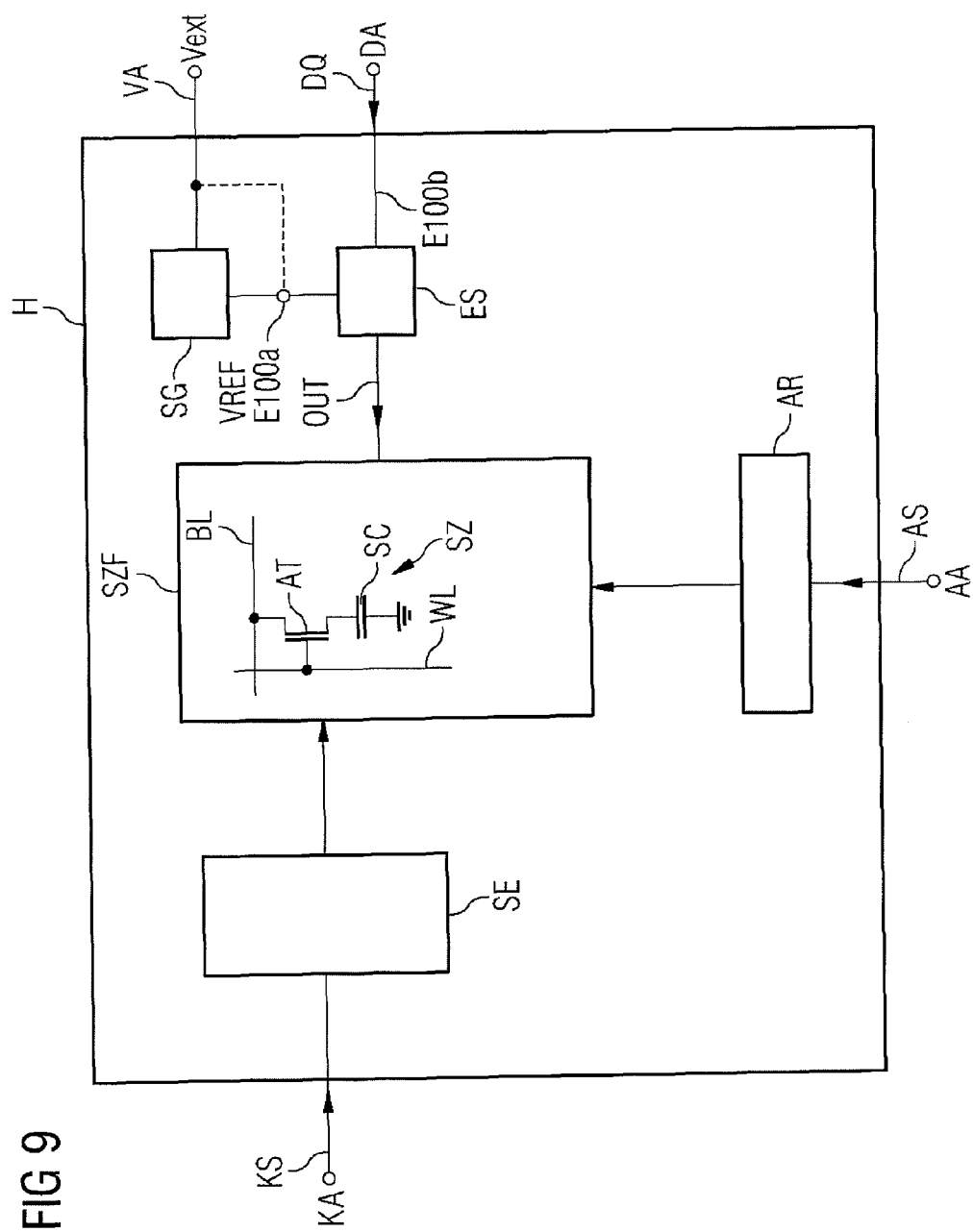
FIG. 9 shows an integrated semiconductor memory including the integrated circuit for receiving data.

FIG. 9 shows an integrated semiconductor memory H which comprises an embodiment of the integrated circuit for receiving data ES shown in FIG. 2, 4, 5, 6 or 7. A control unit SE is connected to a memory input connection KA for applying command signals KS. An address register AR is connected to an address connection AA for applying address signals AS. In the event of a write access operation to a memory cell SZ which is arranged at a crossover point between a word line WL and a bit line BL within a memory cell array SZF, a write command is applied to the control memory input connection KA. In order to select the memory cell SZ, a corresponding address signal AS is applied to the address connection AA. Feeding a corresponding potential state to the word line WL turns on a selection transistor AT of a DRAM memory cell, as a result of which a storage capacitor SC is conductively connected to the bit line BL.

In order to write in a data item, a data signal DQ is applied to a data connection DA. The data signal DQ is supplied to the second input connection E100b of the integrated circuit ES. The reference signal VREF is supplied to the first input connection E100a of the integrated circuit. The reference signal is generated by driving a controllable voltage generator SG with an external supply voltage Vext which is applied to a memory supply voltage connection VA. Alternatively, the reference signal VREF may also be directly applied to the memory supply voltage connection VA. In this case, the memory supply voltage connection VA is directly connected to the first input connection E100a of the integrated circuit rather than via the controllable voltage generator SG, which is indicated by the dashed line in FIG. 9. The integrated circuit ES generates, at the output, the output signal OUT in which the duty cycle of the data signal DQ is retained. Using the embodiments of the integrated circuits ES shown in FIGS. 2 to 9 thus makes it possible to use a data input signal DQ to generate a distortion-free data output signal OUT which is supplied to the memory cell array SZF for storage.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit, comprising:
   an input receiver circuit configured to receive an input signal and a reference signal and to generate first and second input control signals, wherein a respective level of the first and second input control signals is generated on the basis of a respective level of the input signal and of the reference signal such that a level profile of the first input control signal is complementary to a level profile of the second input control signal;
   a first comparator circuit configured to generate a first comparison signal on the basis of the levels of the first and second input control signals;
   a second comparator circuit configured to generate a second comparison signal on the basis of the levels of the first and second input control signals;
   an inverter circuit configured to generate an inverted second comparison signal from the second comparison signal;
   a delay circuit being configured to generate a delayed first comparison signal from the first comparison signal;
   a first amplifier circuit for generating a first amplified output signal from the delayed first comparison signal, the first amplified output signal being amplified with respect to the delayed first comparison signal;
   a second amplifier circuit including an input connected to an output of the inverter circuit for receiving the inverted second comparison signal and for generating a second amplified output signal from the inverted second comparison signal, the second amplified output signal being amplified with respect to the inverted second comparison signal, wherein level profiles of the first and second amplified output signals are not complementary and the first and second amplified output signals transition from a same first state to a same second state substantially simultaneously; and
   an output connection terminal connected to the outputs of the first and second amplifier circuits for generating a single, common output signal by superimposing the first and second amplified output signals.

2. The integrated circuit according to claim 1, further comprising:
   an activation circuit for activating and deactivating the delay circuit in response to an activation signal.

3. The integrated circuit according to claim 2, further comprising:
   a first controllable switch that is connected between a reference potential and the first amplifier circuit, wherein the first controllable switch is operable to be turned on in response to a state of the first activation control signal, thereby connecting the first amplifier circuit to the reference potential.

4. The integrated circuit according to claim 3, further comprising:
   a second controllable switch connected between the reference potential and the second amplifier circuit, wherein the second controllable switch is operable to be turned on, in response to a state of the first activation control signal, thereby connecting the second amplifier circuit to the reference potential.

5. The integrated circuit according to claim 1, wherein:
   the first and second comparator circuits are configured to be activated by an applied activation signal;
   the first comparator circuit generates the first comparison signal on the basis of a level of the first and second input control signals in response to being activated; and
   the second comparator circuit generates the second comparison signal on the basis of a level of the first and second input control signals in response to being activated.

6. The integrated circuit according to claim 1, further comprising:
   a complimentary inverter circuit for generating an inverted first comparison signal from the first comparison signal;
   a complimentary delay circuit for generating a delayed second comparison signal from the second comparison signal;
   a first complimentary amplifier circuit for generating a first complimentary amplified output signal from the delayed second comparison signal, the first complimentary amplified output signal being amplified with respect to the delayed second comparison signal; and a second complimentary amplifier circuit for generating a second complimentary amplified output signal from the inverted first comparison signal, the second complimentary amplified output signal being amplified with respect to the inverted first comparison signal.

7. The integrated circuit according to claim 6, further comprising:

a complimentary activation circuit for activating and deactivating the complimentary delay circuit in response to a state of an applied activation signal.

8. The integrated circuit according to claim 7, further comprising:

a first complimentary controllable switch connected between a supply potential and the first complimentary amplifier circuit, wherein the first complimentary controllable switch is operable to be turned on in response to a state of the applied activation signal, thereby connecting the first complimentary amplifier circuit to the supply potential.

9. The integrated circuit according to claim 8, further comprising:

a second complimentary controllable switch that is connected between the supply potential and the second complimentary amplifier circuit, wherein the second complimentary controllable switch is operable to be turned on in response to a state of the applied activation signal, thereby connecting the second complimentary amplifier circuit to the supply potential.

10. The integrated circuit according to claim 9, wherein the first and second controllable switches and the first and second complimentary controllable switches each comprise a switching transistor.

11. The integrated circuit according to claim 10, wherein the first and second controllable switches and the first and second complimentary controllable switches each comprise switching transistors of different conductivity types.

12. The integrated circuit according to claim 1, wherein the input receiver circuit comprises:

a first transistor for generating, on a first input control connection, the first input control signal, and for receiving, on a first control connection, a first control signal; and a second transistor for generating, on a second input control connection, the second input control signal, and for receiving, on a second control connection, a second control signal;

wherein the first input control connection of the first transistor is connected, via a first resistor, to a supply potential, and a first current source connection of the first transistor is connected, via a current source, to a reference potential;

wherein the second input control connection of the second transistor is connected, via a second resistor, to the supply potential, and a second current source connection of the second transistor is connected, via the current source, to the reference potential.

13. The integrated circuit according to claim 12, wherein:

the first comparator circuit comprises a first differential amplifier circuit and the second comparator circuit comprises a second differential amplifier circuit, the differential amplifier circuits each comprising a first input connection for applying a respective input signal and a second input connection for applying a respective reference signal, the first input control connection of the first transistor of the input receiver circuit is connected to the second input control connection of the first differential amplifier circuit and to the first input control connection of the second differential amplifier circuit; and the second input control connection of the second transistor of the input receiver circuit is connected to the first input control connection of the first differential amplifier circuit and to the second input control connection of the second differential amplifier circuit.

14. The integrated circuit according to claim 1, wherein the inverter circuit comprises a tristate inverter.

15. The integrated circuit according to claim 1, wherein the delay circuit comprises a CMOS transfer gate.

16. The integrated circuit according to claim 1, wherein the first and second amplifier circuits each comprise an inverter circuit.

17. The integrated circuit of claim 1, wherein the output signal of the output connection terminal has a duty cycle of fifty percent for a high level and fifty percent for a low level.

* * * * *